(12) United States Patent  
Woychik et al.

(10) Patent No.: US 8,723,049 B2
(45) Date of Patent: May 13, 2014

(54) LOW-STRESS TSV DESIGN USING CONDUCTIVE PARTICLES

(75) Inventors: Charles G. Woychik, San Jose, CA (US); Kishor Desai, Fremont, CA (US); Ilyas Mohammed, Santa Clara, CA (US); Terrence Caskey, Santa Cruz, CA (US)

(73) Assignee: Tessera, Inc., San Jose, CA (US)

( * ) Notice: Subject to any disclaimer, the term of this patent is extended or adjusted under 35 U.S.C. 154(b) by 253 days.

(21) Appl. No.: 13/156,609

(22) Filed: Jun. 9, 2011

(65) Prior Publication Data

US 2012/0314384 A1 Dec. 13, 2012

(51) Int. Cl.
*H05K 1/11* (2006.01)

(52) U.S. Cl.
USPC ........... 174/262; 174/261; 174/263; 174/264; 174/265; 174/266; 361/760; 361/782; 361/783; 257/E21.585; 438/610; 438/629; 438/667; 438/668

(58) Field of Classification Search
USPC .................. 174/261–266; 361/760, 782, 783; 257/E21.585; 438/610, 629, 667, 668
See application file for complete search history.

(56) References Cited

U.S. PATENT DOCUMENTS

| | | | |
|---|---|---|---|
| 5,540,379 A * | 7/1996 | Kazem-Goudarzi et al. | 228/248.5 |
| 5,573,859 A * | 11/1996 | Suppelsa | 428/553 |
| 5,624,741 A * | 4/1997 | Scott | 428/210 |
| 5,817,404 A * | 10/1998 | Kawakita et al. | 428/209 |
| 6,143,116 A * | 11/2000 | Hayashi et al. | 156/233 |
| 6,286,206 B1 * | 9/2001 | Li | 29/840 |
| 6,641,898 B2 * | 11/2003 | Yazaki et al. | 428/209 |
| 6,774,316 B1 * | 8/2004 | Suzuki et al. | 174/262 |
| 6,809,268 B2 * | 10/2004 | Hayashi et al. | 174/260 |
| 6,930,395 B2 * | 8/2005 | Tomekawa et al. | 257/773 |
| 6,972,070 B2 * | 12/2005 | Yazaki et al. | 156/308.2 |
| 2003/0006066 A1 * | 1/2003 | Appelt et al. | 174/261 |
| 2005/0121768 A1 | 6/2005 | Edelstein et al. | |
| 2005/0148164 A1 | 7/2005 | Casey et al. | |
| 2006/0027934 A1 * | 2/2006 | Edelstein et al. | 257/774 |
| 2006/0274510 A1 * | 12/2006 | Nakada et al. | 361/748 |
| 2007/0232059 A1 | 10/2007 | Abe | |

(Continued)

FOREIGN PATENT DOCUMENTS

EP 2056343 A2 5/2009
JP 2011249408 A 12/2011

OTHER PUBLICATIONS

Inernational Search Report and Written Opinion for Application No. PCT/US2012/041247 dated Sep. 25, 2012.

*Primary Examiner* — Hung S Bui
*Assistant Examiner* — James Wu
(74) *Attorney, Agent, or Firm* — Lerner, David, Littenberg, Krumholz & Mentlik, LLP

(57) ABSTRACT

A component can include a substrate having a first surface and a second surface remote therefrom, an opening extending in a direction between the first and second surfaces, and a conductive via extending within the opening. The substrate can have a CTE less than 10 ppm/° C. The conductive via can include a plurality of base particles each including a first region of a first metal substantially covered by a layer of a second metal different from the first metal. The base particles can be metallurgically joined together and the second metal layers of the particles can be at least partially diffused into the first regions. The conductive via can include voids interspersed between the joined base particles. The voids can occupy 10% or more of a volume of the conductive via.

23 Claims, 5 Drawing Sheets

(56) References Cited

U.S. PATENT DOCUMENTS

2009/0202834 A1* 8/2009 Hirai et al. .................... 428/402
2010/0032809 A1* 2/2010 Collins et al. ................. 257/621
2010/0096708 A1* 4/2010 Eckstein ....................... 257/414

* cited by examiner

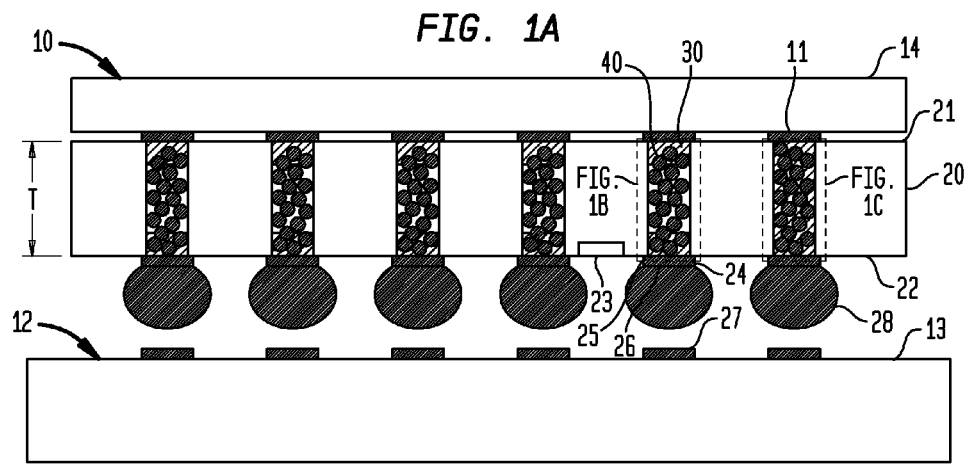
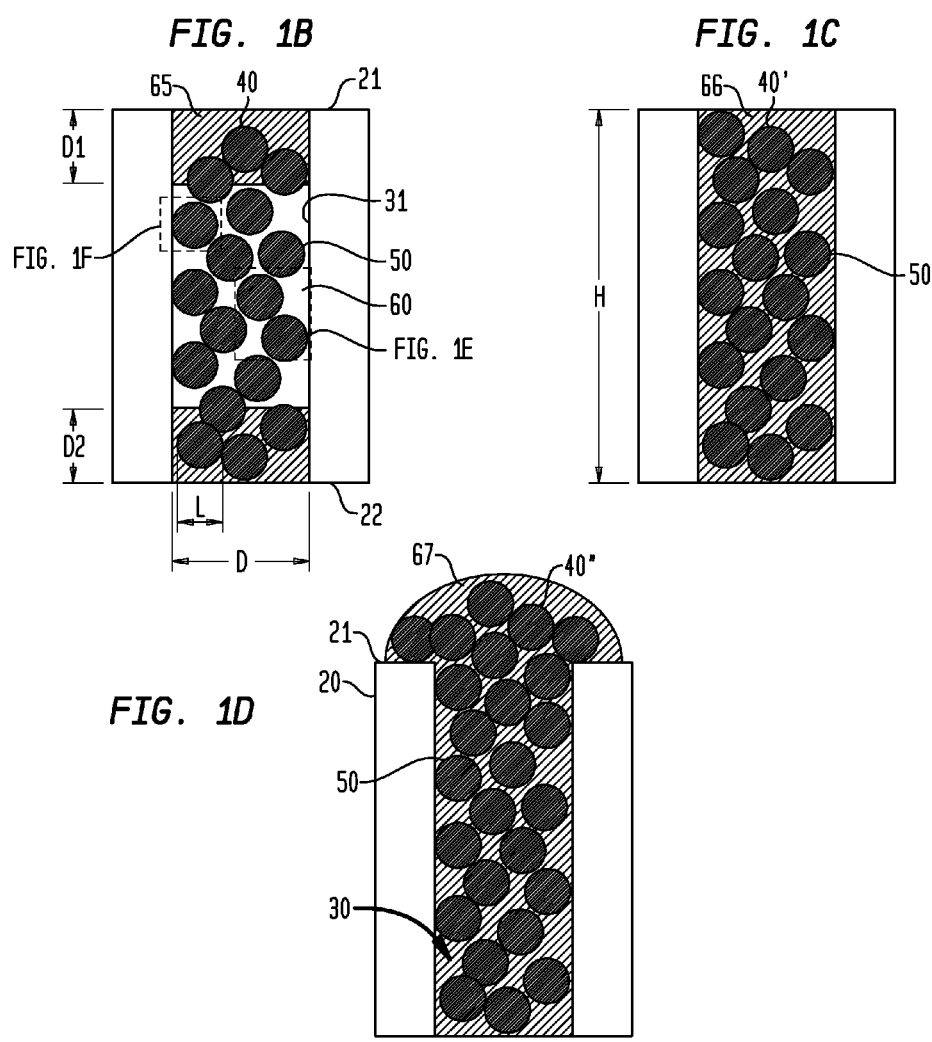

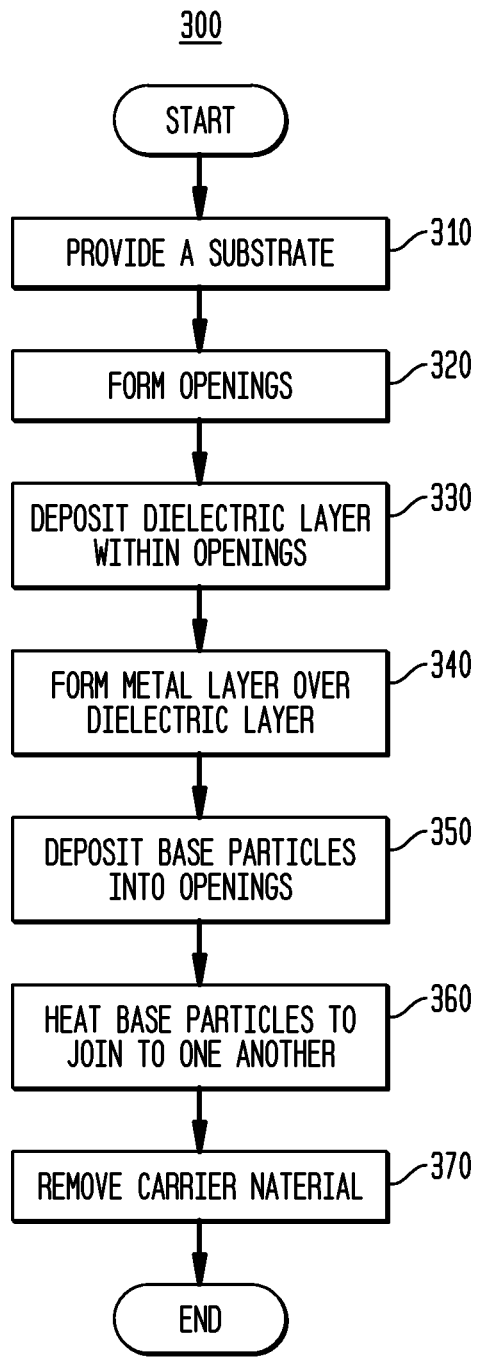

LOW-STRESS TSV DESIGN USING CONDUCTIVE PARTICLES

BACKGROUND OF THE INVENTION

The present invention relates to packaging of microelectronic devices, especially the packaging of semiconductor devices.

Microelectronic elements generally comprise a thin slab of a semiconductor material, such as silicon or gallium arsenide, commonly called a die or a semiconductor chip. Semiconductor chips are commonly provided as individual, prepackaged units. In some unit designs, the semiconductor chip is mounted to a substrate or chip carrier, which is in turn mounted on a circuit panel, such as a printed circuit board.

The active circuitry is fabricated in a first face of the semiconductor chip (e.g., a front surface). To facilitate electrical connection to the active circuitry, the chip is provided with bond pads on the same face. The bond pads are typically placed in a regular array either around the edges of the die or, for many memory devices, in the die center. The bond pads are generally made of a conductive metal, such as copper, or aluminum, around 0.5 μm thick. The bond pads could include a single layer or multiple layers of metal. The size of the bond pads will vary with the device type but will typically measure tens to hundreds of microns on a side.

Through-silicon vias (TSVs) are used to connect the bond pads with a second face of the semiconductor chip opposite the first face (e.g., a rear surface). A conventional via includes a hole penetrating through the semiconductor chip and a conductive material extending through the hole from the first face to the second face. The bond pads may be electrically connected to vias to allow communication between the bond pads and conductive elements on the second face of the semiconductor chip.

Conventional TSV holes may reduce the portion of the first face that can be used to contain the active circuitry. Such a reduction in the available space on the first face that can be used for active circuitry may increase the amount of silicon required to produce each semiconductor chip, thereby potentially increasing the cost of each chip.

Conventional vias may have reliability challenges because of a non-optimal stress distribution inside of the vias and a mismatch of the coefficient of thermal expansion (CTE) between a semiconductor chip, for example, and the structure to which the chip is bonded. For example, when conductive vias within a semiconductor chip are insulated by a relatively thin and stiff dielectric material, significant stresses may be present within the vias. In addition, when the semiconductor chip is bonded to conductive elements of a polymeric substrate, the electrical connections between the chip and the higher CTE structure of the substrate will be under stress due to CTE mismatch.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/O's." These I/O's must be interconnected with the I/O's of other chips. The interconnections should be short and should have low impedance to minimize signal propagation delays. The components which form the interconnections should not greatly increase the size of the assembly. Similar needs arise in other applications as, for example, in data servers such as those used in internet search engines. For example, structures which provide numerous short, low-impedance interconnects between complex chips can increase the bandwidth of the search engine and reduce its power consumption.

Despite the advances that have been made in semiconductor via formation and interconnection, there is still a need for improvements in order to minimize the size of semiconductor chips, while enhancing electrical interconnection reliability. These attributes of the present invention may be achieved by the construction of the microelectronic packages as described hereinafter.

BRIEF SUMMARY OF THE INVENTION

In accordance with an aspect of the invention, a component can include a substrate having a first surface and a second surface remote therefrom, an opening extending in a direction between the first and second surfaces, and a conductive via extending within the opening. The substrate can have a CTE less than 10 ppm/° C. The conductive via can include a plurality of base particles each including a first region of a first metal substantially covered by a layer of a second metal different from the first metal. The base particles can be metallurgically joined together and the second metal layers of the particles can be at least partially diffused into the first regions. The conductive via can include voids interspersed between the joined base particles. The voids can occupy 10% or more of a volume of the conductive via.

In a particular embodiment, the component can also include a polymer medium interspersed between the joined base particles and extending at least to a penetration depth from at least one of the first and second surfaces within the opening. In one embodiment, the component can also include solder interspersed between the joined base particles and extending at least to a penetration depth from at least one of the first and second surfaces within the opening.

In accordance with another aspect of the invention, a component can include a substrate having a first surface and a second surface remote therefrom, an opening extending in a direction between the first and second surfaces, and a conductive via extending within the opening. The substrate can have a CTE less than 10 ppm/° C. The conductive via can include a plurality of base particles each including a first region of a first metal substantially covered by a layer of a second metal different from the first metal. The base particles can be metallurgically joined together and the second metal layers of the particles can be at least partially diffused into the first regions. The conductive via can include solder interspersed between the joined base particles and extending at least to a penetration depth from at least one of the first and second surfaces within the opening.

In an exemplary embodiment, the penetration depth can be equal to a height of the conductive via. In a particular embodiment, the conductive via can also include voids interspersed between the joined base particles. The voids can occupy 10% or more of a volume of the conductive via. In one embodiment, the substrate can embody a plurality of active semiconductor devices adjacent the second surface, and the conductive via can be electrically connected with at least one of a plurality of conductive elements at the second surface. In an exemplary embodiment, the conductive via can connect with a second conductive via within the substrate that is electrically connected with the conductive pad. In a particular embodiment, the second via can include a doped semiconductor material. In one embodiment, the opening can extend between the first and second surfaces of the substrate.

In a particular embodiment, the substrate can be a material selected from the group consisting of: semiconductor material, ceramic, and glass. In an exemplary embodiment, each first metal region can be a metal selected from the group consisting of: copper and an alloy including copper. In one embodiment, each second metal layer can be a tin alloy including a metal selected from the group consisting of: silver, copper, indium, zinc, and bismuth. In a particular embodiment, at least portions of the second metal layer can have a melting temperature lower than the first metal region. In an exemplary embodiment, the Young's modulus of the conductive via can be at most 50% of the Young's modulus of the metals included in the via. In one embodiment, an average length of the base particles can be at most half of an average diameter of the conductive via. In a particular embodiment, the second metal layer of each base particle can have a thickness that is between 2% and 25% of a thickness of the base particle.

In one embodiment, the opening can define an inner surface extending from the first surface toward the second surface. The component can also include an insulating dielectric layer coating the inner surface. The dielectric layer can separate and insulate the conductive via from the substrate at least within the opening. In an exemplary embodiment, the component can also include a third metal layer overlying the dielectric layer. In a particular embodiment, at least some of the base particles can be metallurgically joined to the third metal layer by the second metal layers.

In a particular embodiment, at least some of the base particles can also include a non-metal core region surrounded by the first metal region. In an exemplary embodiment, each non-metal core region can be a material selected from the group consisting of: silica, ceramic, graphite, and polymer. In a particular embodiment, the first metal region of each base particle can have a thickness that is greater than a thickness of the second metal layer of the base particle. In one embodiment, the non-metal core region can be a solid inorganic dielectric material. The Young's modulus of the conductive via can be at most 50% of the Young's modulus of the metals and the solid inorganic dielectric material included in the via.

In accordance with yet another aspect of the invention, a component can include a substrate having a first surface and a second surface remote therefrom, an opening extending in a direction between the first and second surfaces, and a conductive via extending within the opening. The substrate can have a CTE less than 10 ppm/° C. The conductive via can include a plurality of base particles each including a first region of a first metal substantially covered by a layer of a second metal different from the first metal. The base particles can be metallurgically joined together. The second metal layers of the particles can be at least partially diffused into the first regions. The conductive via can include interstitial particles occupying a volume of at least 10% a volume of the conductive via.

In an exemplary embodiment, the interstitial particles can have a CTE less than 10 ppm/° C. In one embodiment, the Young's modulus of the conductive via can be at most 50% of the Young's modulus of the metals and the materials of the interstitial particles included in the via. In a particular embodiment, at least some of the interstitial particles are third metal particles. In an exemplary embodiment, at least some of the interstitial particles can have a non-metal core region. The non-metal can be selected from the group consisting of: silica, ceramic, graphite, and polymer. In one embodiment, each non-metal core region can be surrounded by a third metal layer.

Further aspects of the invention provide systems that incorporate microelectronic structures according to the foregoing aspects of the invention, composite chips according to the foregoing aspects of the invention, or both in conjunction with other electronic devices. For example, the system may be disposed in a single housing, which may be a portable housing. Systems according to preferred embodiments in this aspect of the invention may be more compact than comparable conventional systems.

In accordance with still another aspect of the invention, a method of fabricating a component can include providing a substrate having a first surface and a second surface remote therefrom, the substrate having a CTE less than 10 ppm/° C., the substrate having an opening extending from the first surface towards the second surface. The method can also include depositing a plurality of base particles into the opening, each base particle including a first metal region and a second metal layer covering the first metal region, the second metal layer having a melting point below 400° C., the first metal region having a melting point of 500° C. or more. The method can further include heating the base particles so that each second metal layer fuses the base particles to one another to form a continuous conductive via extending within the opening, the conductive via including voids interspersed between the joined base particles, the voids occupying 10% or more of a volume of the conductive via.

In one embodiment, the substrate can embody a plurality of active semiconductor devices adjacent the second surface. The conductive via can be electrically connected with at least one of a plurality of conductive elements at the second surface. In an exemplary embodiment, the method can also include, after the step of heating the base particles, planarizing the first surface. In a particular embodiment, the method can also include depositing a polymer medium into at least some of the voids interspersed between the joined base particles. The polymer medium can extend at least to a penetration depth from at least one of the first and second surfaces within the opening. In one embodiment, the method can also include depositing solder into at least some of the voids interspersed between the joined base particles. The solder can extend at least to a penetration depth from at least one of the first and second surfaces within the opening.

In a particular embodiment, each first metal region can be a metal selected from the group consisting of: copper, nickel, aluminum, and tungsten, and an alloy including copper. In an exemplary embodiment, each second metal layer can be a metal selected from the group consisting of: tin, bismuth, indium, cadmium, selenium, zinc, and alloys thereof. In one embodiment, each base particle can include a barrier layer between the first metal region and the second metal layer. In a particular embodiment, the base particles can be provided in a liquid carrier material. In an exemplary embodiment, the step of depositing the base particles into the opening can be performed by dispensing, inkjet printing, laser printing, screen printing, or stenciling. In one embodiment, the liquid carrier material can evaporate as a result of the heating step. In a particular embodiment, the liquid carrier material can include a fluxing component. In an exemplary embodiment, the method can also include, during or after the heating step, performing a vacuum treatment to remove the fluxing component.

In an exemplary embodiment, the second metal layer can be a bi-metal layer covering the first metal region. The step of heating can heat the base particles to a transient liquid phase reaction temperature. Each second bi-metal layer can form a eutectic low melt around the first metal region. In one embodiment, the eutectic low melt of at least some adjacent ones of the base particles can diffuse into the first metal regions of the adjacent base particles. In a particular embodiment, each second bi-metal layer can include a layer of tin and a layer of an alloy including a metal selected from the group consisting of: silver, copper, indium, zinc, and bismuth. In an exemplary embodiment, the opening can define an inner surface extending from the first surface toward the second surface. The method can also include, before forming the conductive via, depositing an insulating dielectric layer coating the inner surface.

In one embodiment, the method can also include, before forming the conductive via, forming a third metal layer overlying the dielectric layer and lining the opening. In a particular embodiment, the step of forming the conductive via can metallurgically join at least some of the base particles with the third metal layer. In an exemplary embodiment, the step of depositing the base particles into the opening can include depositing a mixture of the base particles and interstitial particles into the opening. The interstitial particles can be incorporated into the structure of the conductive via.

In a particular embodiment, at least some of the interstitial particles can be third metal particles. In one embodiment, the interstitial particles include at least one metal selected from the group consisting of: silver, gold, tungsten, molybdenum, and nickel. In an exemplary embodiment, at least some of the interstitial particles can have a non-metal core region. The non-metal can be selected from the group consisting of: silica, ceramic, graphite, and polymer. In a particular embodiment, at least some of the base particles can also include a non-metal core region surrounded by the first metal region. In one embodiment, each non-metal core region can be a material selected from the group consisting of: silica, ceramic, graphite, and polymer.

BRIEF DESCRIPTION OF THE DRAWINGS

FIG. 1A is a diagrammatic sectional view of a stacked microelectronic assembly according to an embodiment of the present invention.

FIG. 1B is an enlarged fragmentary sectional view of a portion of FIG. 1A illustrating a conductive via according to the invention.

FIG. 1C is an enlarged fragmentary sectional view of a portion of FIG. 1A illustrating a conductive via according to the invention.

FIG. 1D is an enlarged fragmentary sectional view of an alternative embodiment of FIG. 1C.

FIG. 3 is a flow chart illustrating processes in an exemplary method of fabricating the component of FIG. 1A.

DETAILED DESCRIPTION

Figure 1E:
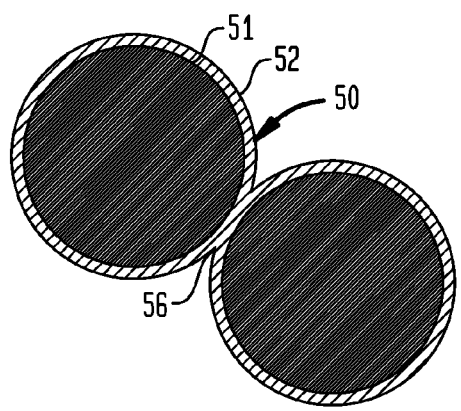
FIG. 1E is an enlarged fragmentary sectional view of a portion of FIG. 1B illustrating an electrical connection between adjacent base particles.

As illustrated in FIGS. 1A and 1B, a component 10 can include a silicon substrate 20 having a rear surface or first surface 21 and a front surface or second surface 22 remote therefrom and a plurality of conductive vias or through-silicon vias 40 extending therethrough within respective openings 30 between the first and second surfaces. The microelectronic unit 10 can also include a microelectronic element 14 adjacent to the first surface 21 that is electrically connected with the substrate 20 through conductive elements 11 of the microelectronic element. The component 10 can be electrically connected with a package substrate or PCB 12 adjacent to the second surface 22.

In some embodiments, the substrate 20 may be a semiconductor chip, a wafer, or the like. The substrate 20 preferably has a coefficient of thermal expansion ("CTE") less than $10*10^{-6}/°$ C. (or ppm/° C.). In a particular embodiment, the substrate 20 can have a CTE less than 7 ppm/° C. The substrate 20 may consist essentially of an inorganic material such as silicon. In embodiments wherein the substrate 20 is made of a semiconductor, such as silicon, a plurality of active semiconductor devices (e.g., transistors, diodes, etc.) can be embodied in the substrate in an active semiconductor region 23 thereof located adjacent the first surface 21 or the second surface 22. The thickness of the substrate 20 between the second surface 22 and the first surface 21 typically is less than 200 μm, and can be significantly smaller, for example, 130 μm, 70 μm or even smaller. In a particular embodiment, the substrate 20 can be made from a material selected from the group consisting of: semiconductor material, ceramic, and glass.

In FIG. 1A, the directions parallel to the first surface 21 are referred to herein as "horizontal" or "lateral" directions, whereas the directions perpendicular to the first surface are referred to herein as upward or downward directions and are also referred to herein as the "vertical" directions. The directions referred to herein are in the frame of reference of the structures referred to. Thus, these directions may lie at any orientation to the normal or gravitational frame of reference. A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

The substrate 20 can also include a plurality of conductive elements such as conductive pads 24 exposed at the second surface 22. While not specifically shown in FIGS. 1A and 1B, active semiconductor devices in the active semiconductor region 23, when present, typically are conductively connected to the conductive pads 24. The active semiconductor devices, thus, are accessible conductively through wiring incorporated extending within or above one or more dielectric layers of the substrate 20. In some embodiments (not shown), the conductive pads 24 may not be directly exposed at the second surface 22 of the substrate 20. Instead, the conductive pads 24 may be electrically connected to traces extending to terminals that are exposed at the second surface 22 of the substrate 20. The conductive pads 24 and any of the other conductive structures disclosed herein can be made from any electrically conductive metal, including for example, copper, aluminum, or gold. The conductive pads 24 and any of the conductive pads disclosed herein can have any top-view shape, including a circle, oval, triangle, square, rectangle, or any other shape.

As used in this disclosure, a statement that an electrically conductive element is "exposed at" a surface of a substrate indicates that the electrically conductive element is available for contact with a theoretical point moving in a direction perpendicular to the surface of the substrate toward the surface of the substrate from outside the substrate. Thus, a terminal or other conductive element which is exposed at a surface of a substrate may project from such surface; may be flush with such surface; or may be recessed relative to such surface and exposed through a hole or depression in the substrate.

The substrate 20 can further include a dielectric layer (not shown) located between the second surface 22 and the conductive pads 24. Such a dielectric layer can electrically insulate the conductive pads 24 from the silicon substrate 20. This dielectric layer can be referred to as a "passivation layer" of the substrate 20. The dielectric layer can include an inorganic or organic dielectric material or both. The dielectric layer may include an electrodeposited conformal coating or other dielectric material, for example, a photoimageable polymeric material, for example, a solder mask material. The substrate 20 can further include another dielectric layer (not shown) overlying the first surface 21. In one example, such a dielectric layer can electrically insulate conductive elements, when present, from the first surface 21 of the substrate 20.

In the embodiments described herein, a dielectric layer overlying the first or second surface 21 or 22 can have a thickness that is substantially less than a thickness of the substrate 20, such that the substrate can have an effective CTE that is approximately equal to the CTE of the material of the substrate, even if the CTE of the dielectric layer is substantially higher than the CTE of the substrate material. In one example, the substrate 20 can have an effective CTE less than 10 ppm/° C.

The substrate 20 can include a plurality of openings 30 extending from the first surface 21 partially or completely through a thickness T of the substrate towards the second surface 22. In the embodiment shown, each opening 30 extends from the first surface 21 to a corresponding one of the conductive pads 24. The openings 30 can be arranged in any top-view geometric configuration, including for example, an m×n array, each of m and n being greater than 1.

Each opening 30 includes an inner surface 31 extending from the first surface 21 toward the second surface 22. The inner surface 31 can extend from the conductive pad through the substrate 20 at an angle between 0 and 90 degrees to the horizontal plane defined by the second surface 22. The inner surface 31 can have a constant slope or a varying slope. For example, the angle or slope of the inner surface 31 relative to the horizontal plane defined by the second surface 22 can decrease in magnitude (i.e., become less positive or less negative) as the inner surface penetrates further towards the first surface 21. In a particular embodiment, each opening 30 can be tapered in a direction from the corresponding conductive pad 24 towards the first surface 21. In some examples, each opening 30 can have any three-dimensional shape, including for example, a frusto-conical shape, a cylinder, a cube, or a prism, among others.

The plurality of openings 30 can include a plurality of conductive vias 40 extending within respective ones of the openings 30, each conductive via extending between a respective conductive pad 24 and a conductive contact (not shown) exposed at the second surface 22 for interconnection with another element such as the microelectronic element 14. In a particular embodiment, first and second conductive vias 40 can be connectable to respective first and second electric potentials. In one example, at least some of the conductive vias 40 can each be electrically connected with a second conductive via (not shown) within the substrate 20 which is electrically connected with a respective conductive pad 24. Such a second conductive via can include a doped semiconductor material.

Connection between each of the conductive vias 40 (or any of the other conductive elements described herein) and components external to the substrate 20 can be through conductive masses or conductive bond material such as the conductive masses 28. As shown in FIG. 1A, each solder ball can electrically connect a conductive pad 24 of the substrate 20 with a corresponding conductive pad 27 of the package substrate 12. Such conductive masses can comprise a fusible metal having a relatively low melting temperature, e.g., solder, tin, or a eutectic mixture including a plurality of metals. Alternatively, such conductive masses can include a wettable metal, e.g., copper or other noble metal or non-noble metal having a melting temperature higher than that of solder or another fusible metal. Such wettable metal can be joined with a corresponding feature, e.g., a fusible metal feature of an interconnect element. In a particular embodiment, such conductive masses can include a conductive material interspersed in a medium, e.g., a conductive paste, e.g., metal-filled paste, solder-filled paste or isotropic conductive adhesive or anisotropic conductive adhesive.

Each conductive via 40 can include a plurality of joined base particles 50 that can be electrically connected to a single common conductive pad 24 at the second surface 22 and a conductive contact at the first surface 21. Alternatively, each conductive via 40 can have contact portions exposed at least one of the first and second surfaces 21, 22 of the substrate 20 for electrical interconnection with other elements such as the microelectronic element 14 and the package substrate 12. In one embodiment, each conductive via 40 can extend through a corresponding conductive pad 24 from a bottom surface 25 to a surface 26 thereof. In a particular embodiment, each conductive via 40 can be electrically connected with at least one of the plurality of conductive pads 24 at the second surface 22. In one example, the base particles 50 can have an average length L that is at most half of an average diameter D of the conductive via 40.

Each conductive via 40 can also include voids 60 interspersed between the joined base particles 50. Such voids 60 (and all of the other voids described herein) can be filled with air. In one example, the voids can occupy 10% or more of a volume of the conductive via 40.

In exemplary embodiments, such voids 60 can provide the base particles 50 of the conductive interconnects 40 additional room to expand without generating as much stress within the substrate 20 and/or against the conductive pads 24 at the second surface 22 or conductive contacts at the first surface 21 as if the voids were not present. Such voids can improve the performance of the microelectronic unit 10 in such embodiments, particularly when there is a relatively large mismatch between the CTE of the material of the substrate 20 and the CTE of the materials of the conductive vias 40.

Each conductive via 40 can include a boundary region located adjacent at least one of the first and second surfaces 21, 22. Each boundary region 65 can include, for example, solder or a polymer medium interspersed between the joined base particles 50 and extending to a penetration depth D1 or D2 from the respective first or second surface 21, 22 within the opening 30.

In a particular embodiment wherein the substrate 20 includes a plurality of active semiconductor devices embodied therein in an active semiconductor region 23 thereof located adjacent the second surface 22, the component 10 can have an alternate configuration of FIG. 1A. In such an alternate configuration of the component 10, the second surface 22 of the substrate 20 can be disposed adjacent the microelectronic element 14, and conductive elements (e.g., the conductive pads 24) of the substrate can be joined with the conductive elements 11 of the microelectronic element, using conductive masses such as solder, for example. In such an embodiment, the first surface 21 of the substrate 20 can be disposed adjacent the package substrate 12, and conductive elements at the first surface 21 of the substrate 20 can be joined with the conductive elements 27 of the package substrate 12 through conductive masses such as the solder balls 28.

In the alternative conductive via embodiment shown in FIG. 1C, each conductive via 40' can include a solder region 66, in which solder is interspersed between the joined base particles 50 and extends through a penetration depth that can be equal to a height H of the conductive via.

In another alternative conductive via embodiment shown in FIG. 1D, each conductive via 40" can include base particles 50 that extend above the first surface 21 of the substrate 20. In one example, the base particles 50 can overlie the first surface 21 of the substrate 20. The conductive via 40" can include a solder region 67, in which solder is interspersed between the joined particles 50 within the opening 30 and above the first surface 21 of the substrate 20. In a particular embodiment, the base particles 50 can be initially deposited into the opening 30 such that they extend above the first surface 21 of the substrate 20, and before the base particles are joined to one another, the conductive via 40" can be planarized to the first surface, thereby resulting in the conductive via 40' shown in FIG. 1C. In one example (not shown), each conductive via can include base particles 50 that extend to locations that are recessed below either or both of the first and second surfaces 21, 22 of the substrate 20.

As shown in FIG. 1E, each base particle 50 can include a first region 51 of a first metal substantially covered by a layer 52 of a second metal. Each base particle 50 can include a first metal region 51 made of a metal that is different than a metal comprising the respective second metal region 52, such that at least portions of the second metal layer have a melting temperature lower than the first metal region. Adjacent base particles 50 can be metallurgically joined together by their second metal layers 52. The second metal layers 52 of the adjacent joined particles 50 can be at least partially diffused into the first regions 51 of the joined particles. In a particular example, the second metal layer 52 of each base particle 50 can have a thickness that is between 2% and 25% of a thickness of the base particle.

In an exemplary embodiment, each first metal region can be a metal selected from the group consisting of: copper and an alloy including copper. In one example, each second metal layer can be a tin alloy including a metal selected from the group consisting of: silver, copper, indium, zinc, and bismuth. In one example, each second metal layer 52 can have a melting point below 400° C., and each first metal region 51 can have a melting point of 500° C. or more. In one example, the Young's modulus of the conductive via 40 can be at most 50% of the Young's modulus of the metals included in the conductive via (e.g., the base particles 50 and the metal layer 80).

Figure 1F:
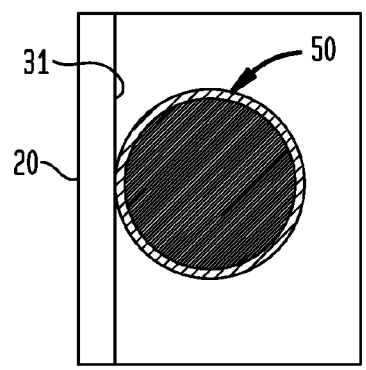
FIG. 1F is an enlarged fragmentary sectional view of a portion of FIG. 1B illustrating contact between a base particle and an inner surface of an opening.

In one embodiment, as shown in FIG. 1F, the inner surface 31 of a particular opening 30 can be exposed to contact with the particles 50 of the conductive via 40 extending therethrough.

Figure 2A:
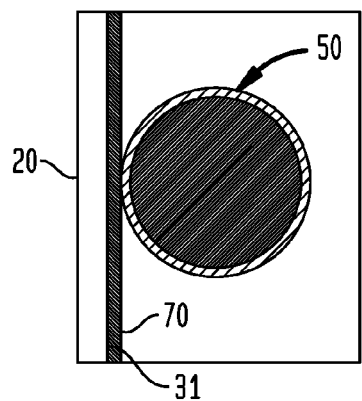
FIGS. 2A and 2B are enlarged fragmentary sectional views of alternative embodiments of FIG. 1F.

In another example, as shown in FIG. 2A, the inner surface 31 of a particular opening 30 can be coated with an insulating dielectric material 70 extending between the first and second surfaces 21, 22, such that corresponding conductive via 40 extends within the insulating dielectric layer. Such an insulating dielectric layer 70 can separate and electrically insulate the conductive via 40 from the material of the substrate 20, at least within the opening. In one example, such an insulating dielectric layer 70 can conformally coat the inner surface 31 exposed within the opening 30. The insulating dielectric material 70 can include an inorganic or organic dielectric material or both. In a particular embodiment, the insulating dielectric material 70 can include a compliant dielectric material, such that the insulating dielectric material has a sufficiently low modulus of elasticity and sufficient thickness such that the product of the modulus and the thickness provide compliancy.

Figure 2B:
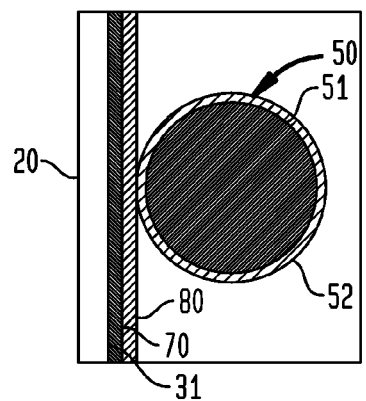

In yet another example, as shown in FIG. 2B, a metal layer 80 can overlie the insulating dielectric layer 70 and the inner surface 31 of a particular opening 30. Such a metal layer 80 can extend between the first and second surfaces 21, 22 within the opening 30. In one example, the metal layer 80 can conformally coat the insulating dielectric layer 70 exposed within the opening 30. In a particular embodiment, the metal layer 80 can include at least one metal selected from the group consisting of: copper, silver, gold, tungsten, molybdenum, nickel, an alloy of copper and tungsten, and an alloy of titanium and tungsten. At least some of the base particles 50 can be metallurgically joined to the metal layer by their respective second metal layers 52. In a particular embodiment, the metal layer 80 can be a barrier material that can help to prevent diffusion of the metals of the base particles 50 into the substrate 20.

In still another example, the metal layer 80 can be multiple layers of metal including a barrier or adhesion layer adjacent the dielectric layer 70 and another metal layer overlying such barrier or adhesion layer to which the base particles 50 can be joined.

In a particular example, when the substrate 20 consists essentially of dielectric material, the insulating dielectric layer 70 may be omitted, and the metal layer 80 may directly contact the inner surfaces 31 of the openings 30 in the substrate 20.

A method of fabricating the microelectronic unit 10 (FIGS. 1A and 1B) will now be described, with reference to the flow chart 300 shown in FIG. 3. In step 310 of the flow chart 300, a substrate 20 can be provided. In step 320 of the flow chart

300, to form the plurality of openings 30 extending from the first surface 21 towards the second surface 22, material can be removed from the first surface of the substrate 20.

The openings 30 can be formed for example, by selectively etching the substrate 20, after forming a mask layer where it is desired to preserve remaining portions of the first surface 21. For example, a photoimageable layer, e.g., a photoresist layer, can be deposited and patterned to cover only portions of the first surface 21, after which a timed etch process can be conducted to form the openings 30.

Inner surfaces 31 of each opening 30, extending downwardly from the first surface 21 towards the second surface 32, may be sloped, i.e., may extend at angles other a normal angle (right angle) to the first surface. Wet etching processes, e.g., isotropic etching processes and sawing using a tapered blade, among others, can be used to form openings 30 having sloped inner surfaces 31. Laser dicing, mechanical milling, among others, can also be used to form openings 30 having sloped inner surfaces 31.

Alternatively, instead of being sloped, the inner surface 31 of each opening 30 may extend in a vertical or substantially vertical direction downwardly from the first surface 21 substantially at right angles to the first surface (as shown in FIG. 1A). Anisotropic etching processes, laser dicing, laser drilling, mechanical removal processes, e.g., sawing, milling, ultrasonic machining, among others, can be used to form openings 30 having essentially vertical inner surfaces 31.

In one example (not shown), such an etch process can be applied to the substrate 20 from above the second surface of the substrate to form the openings 30. If the etch process is performed from above the conductive pads 24, the openings 30 could extend through the conductive pads.

A portion of a passivation layer overlying the first and/or second surfaces 21, 22 of the substrate 20 can also removed during the formation of the openings 30, and such portion can be etched through during the etching of the substrate 20, or as a separate etching step. Etching, laser drilling, mechanical milling, or other appropriate techniques can be used to remove the portion of such a passivation layer.

In step 330 of the flow chart 300, in a particular embodiment (shown in FIG. 2A), after the openings 30 are formed, insulating dielectric layer 70 can be deposited overlying the inner surfaces 31 of the openings 30, such that the conductive vias 40 will extend within the insulating dielectric layer when they are deposited within the openings. In one example, the insulating dielectric layers 70 can be deposited coating the respective inner surfaces 31.

In one embodiment having an insulating dielectric layer overlying the inner surfaces 31 of the openings 30, a mask can be applied to portions of the first surface 21 of the substrate having openings in which it is desired not to form such a dielectric layer. Such uncoated ones of the openings can be later filled with conductive vias 40 that have portions directly contacting material of the substrate 20 (shown in FIG. 1F). Such a conductive via 40 can be included in a particular opening 30 that extends to a ground pad of the conductive pads 24, for example.

Various methods can be used to form such an insulating dielectric layer 70 overlying the inner surfaces 31 of the openings 30, and such methods are described below with reference to FIG. 2A. In particular examples, vapor deposition processes such as chemical vapor deposition (CVD), plasma vapor deposition, or atomic layer deposition (ALD) can be used to deposit a thin insulating dielectric layer overlying the inner surfaces 31 of the openings 30. In one example, tetraethylorthosilicate (TEOS) can be used during a low-temperature process for depositing such an insulating dielectric layer. In exemplary embodiments, a layer of silicon dioxide, borophosphosilicate glass (BPSG), borosilicate glass (BSG), or phosphosilicate glass (PSG) can be deposited overlying the inner surfaces 31 of the openings 30, and such glass can be doped or undoped.

In one example, a flowable dielectric material can be applied to the first surface 21 of the substrate 20, and the flowable material can then more evenly distributed across the inner surfaces 31 of the openings 30 during a "spin-coating" operation, followed by a drying cycle which may include heating. In another example, a thermoplastic film of dielectric material can be applied to the first surface 21 after which the assembly is heated, or is heated in a vacuum environment, i.e., placed in an environment under lower than ambient pressure.

In still another example, the assembly including the substrate 20 can be immersed in a dielectric deposition bath to form a conformal dielectric coating or insulating dielectric material 70. As used herein, a "conformal coating" is a coating of a particular material that conforms to a contour of the surface being coated, such as when the insulting dielectric material 70 conforms to a contour of the inner surfaces 31 of the openings 30. An electrochemical deposition method can be used to form the conformal dielectric material 70, including for example, electrophoretic deposition or electrolytic deposition.

In one example, an electrophoretic deposition technique can be used to form a conformal dielectric coating, such that the conformal dielectric coating is only deposited onto exposed conductive and semiconductive surfaces of the assembly. During deposition, the semiconductor device wafer is held at a desired electric potential and an electrode is immersed into the bath to hold the bath at a different desired potential. The assembly is then held in the bath under appropriate conditions for a sufficient time to form an electrodeposited conformal dielectric material 70 on exposed surfaces of the substrate which are conductive or semiconductive, including but not limited to along the inner surfaces 31 of the openings 30. Electrophoretic deposition occurs so long as a sufficiently strong electric field is maintained between the surface to be coated thereby and the bath. As the electrophoretically deposited coating is self-limiting in that after it reaches a certain thickness governed by parameters, e.g., voltage, concentration, etc. of its deposition, deposition stops.

Electrophoretic deposition forms a continuous and uniformly thick conformal coating on conductive and/or semiconductive surfaces of the substrate 20. In addition, the electrophoretic coating can be deposited so that it does not form on a remaining passivation layer overlying the first surface 21 of the substrate 20, due to its dielectric (nonconductive) property. Stated another way, a property of electrophoretic deposition is that it does not normally form on a layer of dielectric material, and it does not form on a dielectric layer overlying a conductor provided that the layer of dielectric material has sufficient thickness, given its dielectric properties. Typically, electrophoretic deposition will not occur on dielectric layers having thicknesses greater than about 10 microns to a few tens of microns. A conformal dielectric material 70 can be formed from a cathodic epoxy deposition precursor. Alternatively, a polyurethane or acrylic deposition precursor could be used. A variety of electrophoretic coating precursor compositions and sources of supply are listed in Table 1 below.

TABLE 1

| ECOAT NAME | POWERCRON 645 | POWERCRON 648 | CATHOGUARD 325 |
|---|---|---|---|
| MANUFACTURERS | | | |
| MFG | PPG | PPG | BASF |
| TYPE | CATHODIC | CATHODIC | CATHODIC |
| POLYMER BASE | EPOXY | EPOXY | EPOXY |
| LOCATION | Pittsburgh, PA | Pittsburgh, PA | Southfield, MI |
| APPLICATION DATA | | | |
| Pb/Pf-free | Pb-free | Pb or Pf-free | Pb-free |
| HAPs, g/L | | 60-84 | COMPLIANT |
| VOC, g/L (MINUS WATER) | | 60-84 | <95 |
| CURE | 20 min/175 C. | 20 min/175 C. | |
| FILM PROPERTIES | | | |
| COLOR | Black | Black | Black |
| THICKNESS, μm | 10-35 | 10-38 | 13-36 |
| PENCIL HARDNESS | | 2H+ | 4H |
| BATH CHARACTERISTICS | | | |
| SOLIDS, % wt. | 20 (18-22) | 20 (19-21) | 17.0-21.0 |
| pH (25 C.) | 5.9 (5.8-6.2) | 5.8 (5.6-5.9) | 5.4-6.0 |
| CONDUCTIVITY (25 C.) μS | 1000-1500 | 1200-1500 | 1000-1700 |
| P/B RATIO | 0.12-0.14 | 0.12-0.16 | 0.15-0.20 |
| OPERATION TEMP., C. | 30-34 | 34 | 29-35 |
| TIME, sec | 120-180 | 60-180 | 120+ |
| ANODE | SS316 | SS316 | SS316 |
| VOLTS | | 200-400 | >100 |

| ECOAT NAME | ELECTROLAC | LECTRASEAL DV494 | LECTROBASE 101 |
|---|---|---|---|
| MANUFACTURERS | | | |
| MFG | MACDERMID | LVH COATINGS | LVH COATINGS |
| TYPE | CATHODIC | ANODIC | CATHODIC |
| POLYMER BASE | POLYURETHANE | URETHANE | URETHANE |
| LOCATION | Waterbury, CT | Birmingham, UK | Birmingham, UK |
| APPLICATION DATA | | | |
| Pb/Pf-free | | Pb-free | Pb-free |
| HAPs, g/L | | | |
| VOC, g/L (MINUS WATER) | | | |
| CURE | 20 min/149 C. | 20 min/175 C. | 20 min/175 C. |
| FILM PROPERTIES | | | |
| COLOR | Clear (+dyed) | Black | Black |
| THICKNESS, μm | | 10-35 | 10-35 |
| PENCIL HARDNESS | 4H | | |
| BATH CHARACTERISTICS | | | |
| SOLIDS, % wt. | 7.0 (6.5-8.0) | 10-12 | 9-11 |
| pH (25 C.) | 5.5-5.9 | 7-9 | 4.3 |
| CONDUCTIVITY (25 C.) μS | 450-600 | 500-800 | 400-800 |
| P/B RATIO | | | |
| OPERATION TEMP., C. | 27-32 | 23-28 | 23-28 |
| TIME, sec | | | 60-120 |
| ANODE | SS316 | 316SS | 316SS |
| VOLTS | 40, max | | 50-150 |

In another example, the dielectric material 70 can be formed electrolytically. This process is similar to electrophoretic deposition, except that the thickness of the deposited layer is not limited by proximity to the conductive or semiconductive surface from which it is formed. In this way, an electrolytically deposited dielectric layer can be formed to a thickness that is selected based on requirements, and processing time is a factor in the thickness achieved.

In step 340 of the flow chart 300, in a particular embodiment (shown in FIG. 2B), after the insulating dielectric layers 70 are deposited, a metal layer 80 can be formed overlying the insulating dielectric layer and the inner surface 31 of the respective openings 30. In one example, the metal layer 80 can be formed lining the respective openings 30.

To form the metal layers 80, an exemplary method involves depositing a metal layer by one or more of sputtering a primary metal layer onto exposed surfaces of the insulating dielectric layers 70, plating, chemical vapor deposition, plasma vapor deposition, or mechanical deposition. Mechanical deposition can involve the directing a stream of heated metal particles at high speed onto the surface to be coated. This step can be performed by blanket deposition onto the insulating dielectric layers 70, for example.

While essentially any technique usable for forming conductive elements can be used to form the metal layers 80 or other metal elements overlying the first and second surfaces 21, 22, particular techniques as discussed in greater detail in the commonly owned U.S. patent application Ser. No. 12/842,669, filed Jul. 23, 2010, can be employed, which is hereby incorporated by reference herein. Such techniques can include, for example, selectively treating a surface with a laser or with mechanical processes such as milling or sandblasting so as to treat those portions of the surface along the path where the conductive element is to be formed differently than other portions of the surface. For example, a laser or mechanical process may be used to ablate or remove a material such as a sacrificial layer from the surface only along a particular path and thus form a groove extending along the path. A material such as a catalyst can then be deposited in the groove, and one or more metallic layers can be deposited in the groove.

In step 350 of the flow chart 300, after formation of the openings 30 (and, if desired, after formation of the dielectric layers 70 and the metal layers 80), the base particles can be deposited into the openings. In a particular embodiment, the base particles 50 can be provided in a liquid carrier material that can later be removed in step 360 or step 370 of the flow chart 300. The depositing of the base particles 50 into the opening 30 can be performed, for example, by dispensing, inkjet printing, laser printing, screen printing, or stenciling. In one embodiment, the liquid carrier material can include a fluxing component. Such a depositing step can be enhanced by performing the deposition in an evacuated chamber to help deposit the base particles 50 into the openings 30. Alternatively, vacuum can be applied during or after initial deposition from an opposite side of the substrate 20 to help draw the base particles into the openings 30.

In an exemplary embodiment, the liquid carrier material in which the base particles 50 is delivered into the openings 30 can include a conductive matrix material. In a subsequent sintering process, the substrate 20 can be heated to a sintering temperature in which the conductive matrix material undergoes changes which then permanently electrically and mechanically joins the base particles 50 together.

As deposited, i.e., before sintering, the conductive matrix material can include particles or flakes of a high melting-point material such as copper or silver, and particles or flakes a low melting-point material, such as tin, bismuth, or a combination of tin and bismuth. Some particles may have a structure which includes metal or non-metal cores, for example, polymer, silica or graphite cores, and a different metal such as a low melting-point metal thereon.

In some examples, the conductive matrix material may include a "reactive" or uncured polymer. After deposition, the structure can be subsequently heated to a temperature for sintering the conductive matrix material. During this sintering process, the high and low melting point metals fuse together, typically forming intermetallics therebetween, and forming a solid matrix of metal which can have an open cell foam-like appearance. The deposited conductive matrix material may include a medium which escapes from the metallic component thereof during the sintering process, such as by evaporation, such that the conductive matrix material may have voids therein. Alternatively, the conductive matrix material may include a reactive polymer component. Typically, the polymer component cross-links and cures as a result of the sintering process. The polymer component can become interspersed throughout the metal matrix as a result of the sintering process, the polymer material typically being connected together in open cells of the metal matrix. The metal matrix and polymer interspersed throughout may then form a solid conductive structure.

Under certain conditions, after sintering, the conductive matrix material can form a solid structure which subsequently cannot be reflowed except at a temperature substantially higher than the temperature at which the sintering process is performed. Such result may be obtained by sintering particularly when a low melting-point metal, e.g., tin or bismuth, is substantially consumed in the formation of intermetallics with at least one other metal component, of the conductive material, e.g., copper.

Depending upon the application, the temperature at which the conductive matrix material is sintered can be substantially lower than a reflow temperature at which alternative connections made of solder would need to be formed. Metals such as copper or silver can be added to solder to improve mechanical resilience and to increase the melting temperature of the solder. Thus, the structure of the conductive via 40 that has been formed with a conductive matrix material may provide a more mechanically robust system with a lower joining temperature than corresponding solder connections.

In such case, use of such conductive matrix material can help to avoid problems associated with higher temperature joining processes. For example, lower temperature joining processes achieved using a conductive matrix material can help avoid undesirable changes in substrates which include organic materials whose glass transition temperatures are relatively low. Also, lower temperature joining processes may help to address concerns during such joining processes relating to differential thermal expansion of the substrate 20 relative to the microelectronic element 14. In this case, a lower temperature joining process can lead to improved package reliability since reduced thermal excursion during the joining process can lead to less stresses being locked into the assembled microelectronic unit 10.

In a particular example, the conductive matrix material may include a fluxing component as deposited. The fluxing component can assist in removing oxidation byproducts during the sintering process. In one embodiment, the joining process can be conducted using a conductive matrix material that does not have a fluxing component. In such case, the joining process may be performed in a low pressure, e.g., partial vacuum, environment, or one in which oxygen has been evacuated or replaced with another gas.

In step 360 of the flow chart 300, after the base particles 50 are deposited into the openings 30, the base particles can be heated so that each second metal layer 52 fuses the base particles to one another to form a continuous conductive via 40 extending within the opening. In a particular example, after the heating step 360, the conductive via 40 can include voids 60 interspersed between the joined base particles 50. Such voids 60 can occupy 10% or more of a volume of the conductive via 40.

In one example, each second metal layer 52 can have a melting point below 400° C., and each first metal region 51 can have a melting point of 500° C. or more, such that the base particles 50 can be metallurgically joined to one another by heating the base particles to a temperature between 400° C. and 500° C. In one embodiment, at least some of the base particles 50 in at least some of the openings 30 can also be metallurgically joined to the bottom surface 25 of the respective conductive pads 24. In a particular embodiment, the heating step 360 of the flow chart 300 can metallurgically join at least some of the base particles 50 with the metal layer 80. In one example, after the heating step 360, a step of planarizing the first surface 21 can be performed.

In step 370 of the flow chart 300, the carrier material can be removed from within the openings 30. In one embodiment, the liquid carrier material can evaporate as a result of the heating of the base particles 50. In a particular embodiment, during or after the heating step, a vacuum treatment can be performed to remove the fluxing component from the openings 30.

Thereafter, the boundary region 65 can be formed extending within each of the openings 30. In embodiments where the boundary region 65 is a polymer, the boundary region can be formed using similar methods as those described above with respect the insulating dielectric layer 70. In one example, the boundary region 65 can be a polymer medium that is deposited into at least some of the voids 60 that remain within the conductive via 40 after the heating step 360 and/or the carrier removal step 370 of the flow chart 300. Such a polymer medium can extend at least to a penetration depth D1 and/or D2 from at least one of the first and second surfaces 21, 22 within the opening 30.

In embodiments where the boundary region 65 is solder, the boundary region can be formed using similar methods as those described above with respect the conductive masses 28. In a particular example, the boundary region 65 can be solder that is deposited into at least some of the voids 60 that remain within the conductive via 40 after the heating step 360 and/or the carrier removal step 370 of the flow chart 300. Such solder can extend at least to a penetration depth D1 and/or D2 from at least one of the first and second surfaces 21, 22 within the opening 30.

Figure 4A:
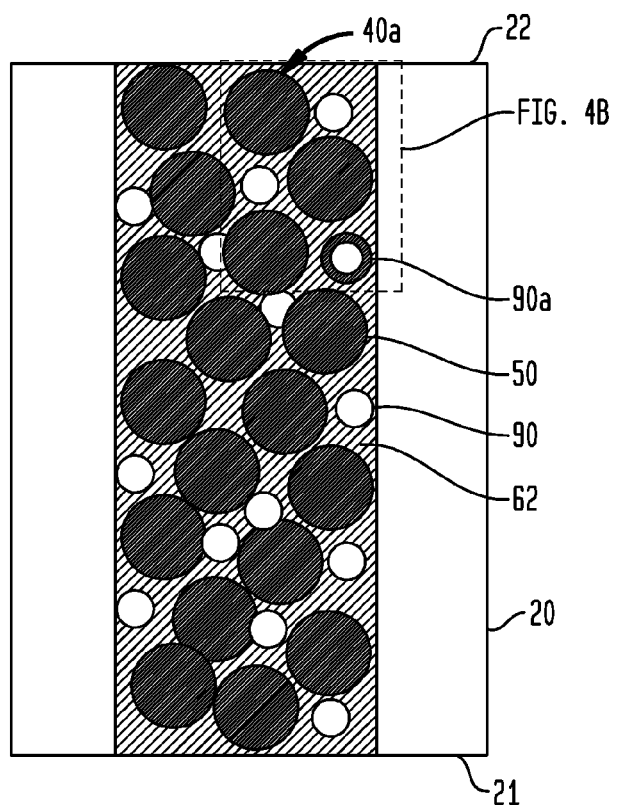
FIG. 4A is an enlarged fragmentary sectional view of an alternative embodiment of FIG. 1B.
Figure 4B:
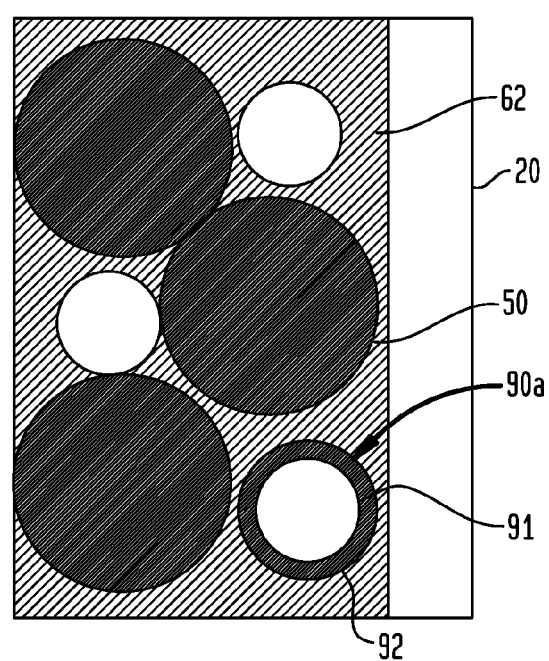
FIG. 4B is an enlarged fragmentary sectional view of a portion of FIG. 4A illustrating an interstitial particle coated with a metal layer.

FIGS. 4A and 4B illustrate a variation of the conductive via 40 of FIGS. 1A and 1B having an alternate configuration. The conductive via 40a is the same as the conductive via 40 described above, except that the conductive via 40a includes interstitial particles 90 and 90a. In a particular embodiment, either or both of the exemplary interstitial particles 90 and 90a can be interspersed between the joined base particles 50 of the conductive via 40a. In one example, the interstitial particles 90 and/or 90a can be incorporated into the structure of the conductive via 40a. In one embodiment, the interstitial particles 90 and/or 90a can occupy a volume of at least 10% of a volume of the conductive via 40a.

One or more of the interstitial particles 90 can include a single region of material, as shown in FIG. 4A. Such a single-material interstitial particle 90 can include a material such as metal, silica, ceramic, graphite, or polymer. Alternatively, as can be seen in FIG. 4B, one or more of the interstitial particles 90a can include a non-metal core region 91, which can include for example, a material such as silica, ceramic, graphite, or polymer. Such a non-metal core region 91 can be surrounded by a third metal layer 92 of a metal such as copper or aluminum.

In a particular embodiment, each interstitial particle 90 and/or 90a can have a CTE less than 10 ppm/° C. In one example, the Young's modulus of the conductive via 40 can be at most 50% of the Young's modulus of the metals included in the via (e.g., the base particles 50 and the metal layer 80) and the materials of the interstitial particles included in the via (e.g., the materials of the interstitial particles 90 and/or 90a).

Each conductive via 40a can include an interstitial region 62 extending between the joined base particles 50 and the interstitial particles 90 and/or 90a. The interstitial region 62 can include for example, solder or a polymer medium. As shown in FIG. 4A, the interstitial region 62 can extend through a penetration depth that can be equal to a height of the conductive via 40a (similar to the solder region 66 shown in FIG. 1C), or alternatively, the interstitial region can be located adjacent at least one of the first and second surfaces 21, 22 and can extend to a penetration depth D1 or D2 from the respective first or second surface 21, 22 within the opening 30 (similar to the boundary regions 65 shown in FIG. 1B).

The conductive vias 40a can be formed using the same method described above with reference to the flow chart 300 shown in FIG. 3, except that step 350, depositing the base particles 50 into the openings 30, can include depositing a mixture of the base particles and the interstitial particles 90 and/or 90a into the openings. In the heating step 360, the base particles 50 and the interstitial particles 90 and/or 90a can be incorporated together into the structure of the conductive via 40a.

Figure 5:
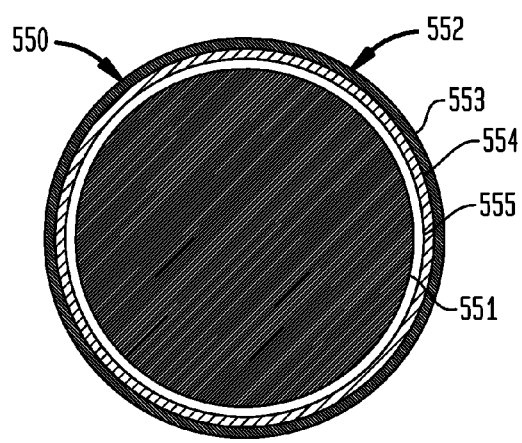
FIG. 5 is an enlarged fragmentary sectional view of an alternative embodiment of a base particle of FIG. 1A.

FIG. 5 illustrates an embodiment of the base particle 50 of FIG. 1E before the heating step 360 shown in the flow chart 300 of FIG. 3. The base particle 550 shown in FIG. 5 is the same as the base particle 50 described above, except that the base particle 550 includes a second bi-metal layer 552 having an outer layer 553 and an inner layer 554. In one example, one of the outer layer 553 and the inner layer 554 can be a layer of tin, and the other of the outer layer and the inner layer can be a layer of an alloy including a metal selected from the group consisting of: silver, copper, indium, zinc, and bismuth.

The base particle 550 also includes a barrier layer 555 extending between the first metal region 551 and the second bi-metal layer 552. Such a barrier layer 555 can include a barrier metal such as tungsten, which may decrease the rate of diffusion of the metals of the second bi-metal layer 552 into the first metal region 551 during the heating step 360 of the flow chart 300.

Conductive vias 40, 40', 40", and 40a can be formed using the base particles 550 using the same method described above with reference to the flow chart 300 shown in FIG. 3, except that in the heating step 360, the base particles can be heated to a transient liquid phase reaction temperature, so that each second bi-metal layer 552 can form a eutectic low melt around the respective first metal region 551. In one embodiment, the eutectic low melt of at least some adjacent ones of the base particles 550 can diffuse into the first metal regions 551 of the adjacent base particles. After heating the base particles 550 during the heating step 360 of the flow chart 300, the base particles 550 can transform into the base particles 50 shown in FIG. 1E. Such base particles 50 can each have a second metal layer 52 bonding adjacent base particles together, the second metal layer including the metals of the inner and outer layers 553, 554.

Figure 6:
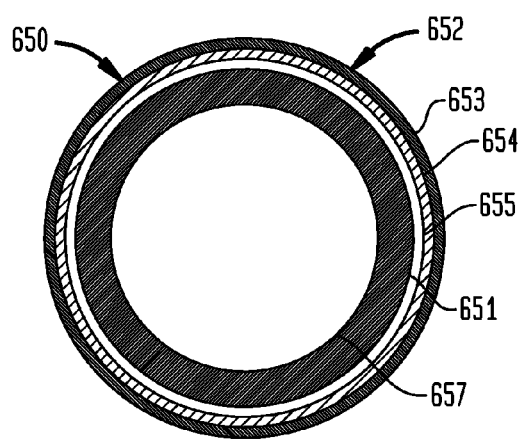
FIG. 6 is an enlarged fragmentary sectional view of another alternative embodiment of a base particle of FIG. 1A.

FIG. 6 illustrates an alternate version of the base particle 550 of FIG. 5 before the heating step 360 shown in the flow chart 300 of FIG. 3. The base particle 650 shown in FIG. 6 is the same as the base particle 650 described above, except that the base particle 650 includes a non-metal core region 657 surrounded by the first metal region 651. Each non-metal core region 657 can be made from one or more materials selected from the group consisting of: silica, ceramic, graphite, and polymer.

In one embodiment, the first metal region 651 of each base particle 650 can have a thickness that is greater than a thickness of the second metal layer 652 of the base particle. In a particular example, the non-metal core region 657 can be a solid inorganic dielectric material, and the Young's modulus of a conductive via 40, 40', 40", or 40a including such base particles 650 can be at most 50% of the Young's modulus of the metals and the solid inorganic dielectric material included in the conductive via.

In one example, a particular conductive via 40, 40', 40", or 40a can be formed using a mixture of any or all of the base particles 50, 550, and 650. In another example, a particular conductive via 40, 40', 40", or 40a can be formed using a mixture of the interstitial particles 90 or 90a and any or all of the base particles 50, 550, and 650.

Figure 7:
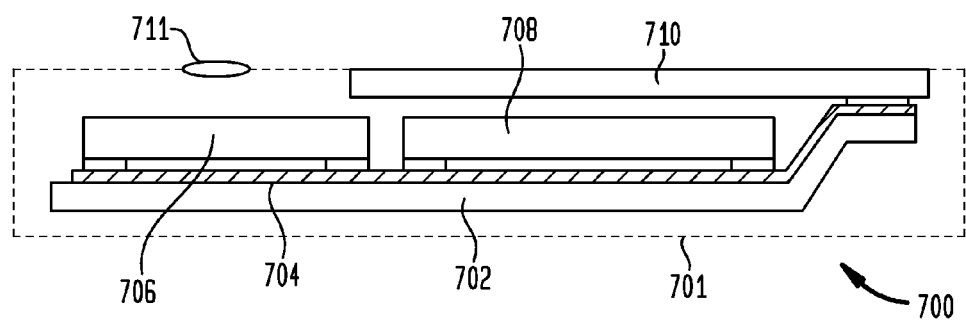
FIG. 7 is a schematic depiction of a system according to one embodiment of the invention.

The microelectronic units described above can be utilized in construction of diverse electronic systems, as shown in FIG. 7. For example, a system 700 in accordance with a further embodiment of the invention includes a microelectronic assembly 706 as described above in conjunction with other electronic components 708 and 710. In the example depicted, component 708 is a semiconductor chip whereas component 710 is a display screen, but any other components can be used. Of course, although only two additional components are depicted in FIG. 7 for clarity of illustration, the system may include any number of such components. The microelectronic assembly 706 may be any of the microelectronic units described above. In a further variant, any number of such microelectronic assemblies 706 can be used.

The microelectronic assembly 706 and components 708 and 710 can be mounted in a common housing 701, schematically depicted in broken lines, and can be electrically interconnected with one another as necessary to form the desired circuit. In the exemplary system shown, the system can include a circuit panel 702 such as a flexible printed circuit board, and the circuit panel can include numerous conductors 704, of which only one is depicted in FIG. 7, interconnecting the components with one another. However, this is merely exemplary; any suitable structure for making electrical connections can be used.

The housing 701 is depicted as a portable housing of the type usable, for example, in a cellular telephone or personal digital assistant, and screen 710 can be exposed at the surface of the housing. Where structure 706 includes a light-sensitive element such as an imaging chip, a lens 711 or other optical device also can be provided for routing light to the structure. Again, the simplified system shown in FIG. 7 is merely exemplary; other systems, including systems commonly regarded as fixed structures, such as desktop computers, routers and the like can be made using the structures discussed above.

The cavities, apertures, and conductive elements disclosed herein can be formed by processes such as those disclosed in greater detail in the co-pending, commonly assigned U.S. patent application Ser. Nos. 12/842,587, 12/842,612, 12/842,651, 12/842,669, 12/842,692, and 12/842,717, filed Jul. 23, 2010, and in published U.S. Patent Application Publication No. 2008/0246136, the disclosures of which are incorporated by reference herein.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A component, comprising:
a substrate having a first surface and a second surface remote therefrom, the substrate having a CTE less than 10 ppm/° C.;
an opening extending in a direction between the first and second surfaces; and
a conductive via extending within the opening, the conductive via including a plurality of base particles each including a first region of a first metal substantially covered by a layer of a second metal different from the first metal, the base particles being metallurgically joined together and the second metal layers of the particles being at least partially diffused into the first regions, the conductive via including voids interspersed between the joined base particles, the voids being filled with air and occupying 10% or more of a volume of the conductive via.

2. The component as claimed in claim 1, further comprising a polymer medium interspersed between the joined base particles and extending at least to a penetration depth from at least one of the first and second surfaces within the opening.

3. The component as claimed in claim 1, further comprising solder interspersed between the joined base particles and extending at least to a penetration depth from at least one of the first and second surfaces within the opening.

4. The component as claimed in claim 1, wherein the substrate embodies a plurality of active semiconductor devices adjacent the second surface, and the conductive via is electrically connected with at least one of a plurality of conductive elements at the second surface.

5. The component as claimed in claim 1, wherein the conductive via connects with a second conductive via within the substrate that is electrically connected with a conductive pad.

6. The component as claimed in claim 5, wherein the second via includes a doped semiconductor material.

7. The component as claimed in claim 1, wherein the opening extends between the first and second surfaces of the substrate.

8. The component as claimed in claim 1, wherein the substrate is a material selected from the group consisting of: semiconductor material, ceramic, and glass.

9. The component as claimed in claim 1, wherein each first metal region is a metal selected from the group consisting of: copper and an alloy including copper.

10. The component as claimed in claim 1, wherein each second metal layer is a tin alloy including a metal selected from the group consisting of: silver, copper, indium, zinc, and bismuth.

11. The component as claimed in claim 1, wherein at least portions of the second metal layer have a melting temperature lower than the first metal region.

12. The component as claimed in claim 1, wherein the Young's modulus of the conductive via is at most 50% of the Young's modulus of the first metal included in the via.

13. The component as claimed in claim 1, wherein an average diameter of the base particles is at most half of an average diameter of the conductive via.

14. The component as claimed in claim 1, wherein the second metal layer of each base particle has a thickness that is between 2% and 25% of a thickness of the base particle.

15. The component as claimed in claim 1, wherein the opening defines an inner surface extending from the first surface toward the second surface, further comprising an insulating dielectric layer coating the inner surface, the dielectric layer separating and insulating the conductive via from the substrate at least within the opening.

16. The component as claimed in claim 15, further comprising a third metal layer overlying the dielectric layer.

17. The component as claimed in claim 16, wherein at least some of the base particles are metallurgically joined to the third metal layer by the second metal layers.

18. The component as claimed in claim 1, wherein at least some of the base particles further include a non-metal core region surrounded by the first metal region.

19. The component as claimed in claim 18, wherein each non-metal core region is a material selected from the group consisting of: silica, ceramic, graphite, and polymer.

20. The component as claimed in claim 18, wherein the first metal region of each base particle has a thickness that is greater than a thickness of the second metal layer of the base particle.

21. The component as claimed in claim 18, wherein the non-metal core region is a solid inorganic dielectric material, and the Young's modulus of the conductive via is at most 50% of the Young's modulus of the metals and the solid inorganic dielectric material included in the via.

22. A system comprising the component according to claim 1 and one or more other electronic components electrically connected to the component.

23. The system as claimed in claim 22, further comprising a housing, said structure and said other electronic components being mounted to said housing.

* * * * *